(12) United States Patent
Riegler et al.

(10) Patent No.: US 9,538,889 B2
(45) Date of Patent: Jan. 10, 2017

(54) RADIAL BLOWER

(71) Applicant: ebm-papst Mulfingen GmbH & Co. KG, Mulfingen (DE)

(72) Inventors: Peter Riegler, Boxberg (DE); Jörg Günther, Dörzbach (DE); Thomas Heli, Langenburg (DE); Walter Hofmann, Mulfingen-Ailringen (DE)

(73) Assignee: EBM-PAPST MULFINGEN GMBH & CO. KG, Mulfingen (DE)

( * ) Notice: Subject to any disclaimer, the term of this patent is extended or adjusted under 35 U.S.C. 154(b) by 289 days.

(21) Appl. No.: 13/860,214

(22) Filed: Apr. 10, 2013

(65) Prior Publication Data
US 2013/0276264 A1 Oct. 24, 2013

(30) Foreign Application Priority Data
Apr. 20, 2012 (EP) .................................... 12164901

(51) Int. Cl.
| | |
|---|---|
| *A47L 5/14* | (2006.01) |
| *F04D 25/06* | (2006.01) |
| *F04D 29/42* | (2006.01) |
| *H02K 7/14* | (2006.01) |
| *F04D 29/58* | (2006.01) |

(52) U.S. Cl.
CPC .............. *A47L 5/14* (2013.01); *F04D 25/068* (2013.01); *F04D 29/4226* (2013.01); *F04D 29/5813* (2013.01); *H02K 7/14* (2013.01); *H02K 11/01* (2016.01); *H02K 11/33* (2016.01); *H01L 2924/0002* (2013.01)

(58) Field of Classification Search
CPC .......... F04D 17/08; F04D 17/25; F04D 17/06; F04D 17/068; F04D 17/16; F04D 29/4226; F04D 29/5813; H02K 5/22; H02K 11/0005

USPC ................. 417/351, 423.5, 423.14
See application file for complete search history.

(56) References Cited

U.S. PATENT DOCUMENTS

| | | | | |
|---|---|---|---|---|
| 5,408,154 | A * | 4/1995 | Meiser et al. .................. | 310/71 |
| 5,743,721 | A * | 4/1998 | Graham et al. .............. | 415/58.4 |
| 6,332,759 | B1 * | 12/2001 | Guillemin .......... | B60H 1/00507 |
| | | | | 417/366 |
| 2009/0267432 | A1* | 10/2009 | Henry et al. .................... | 310/71 |

(Continued)

FOREIGN PATENT DOCUMENTS

| | | |
|---|---|---|
| DE | 600 36 767 T2 | 7/2008 |
| EP | 2 098 733 A2 | 9/2009 |

(Continued)

OTHER PUBLICATIONS

Streng, EP-2236838 with Machine Translation, Jun. 2010.*
European Search Report—Aug. 2, 2012.

*Primary Examiner* — Devon Kramer
*Assistant Examiner* — Kenneth J Hansen
(74) *Attorney, Agent, or Firm* — Brinks Gilson & Lione

(57) ABSTRACT

A blower (1) with a blower housing (2), a blower wheel (4) positioned so as to rotate inside a blower housing (2), an electric motor (6) for the rotational drive of the blower wheel (4), as well as with a saucer-shaped attachment housing (8) positioned externally on the blower housing (2). The attachment housing (8) contains motor-control electronics (10) and exhibits in its connection area facing the blower housing (2) a metallic cover element (14) covering the motor control electronics (10) and protects against an electromagnetic radiation from the electric motor (6).

16 Claims, 3 Drawing Sheets

(56) References Cited

U.S. PATENT DOCUMENTS

2010/0183457 A1* 7/2010 Hattori et al. ............. 417/410.1

FOREIGN PATENT DOCUMENTS

| EP | 2 236 838 A1 | 6/2010 |
|---|---|---|
| JP | 8 303394 A | 11/1996 |
| WO | WO 2008/146152 A1 | 12/2008 |

* cited by examiner

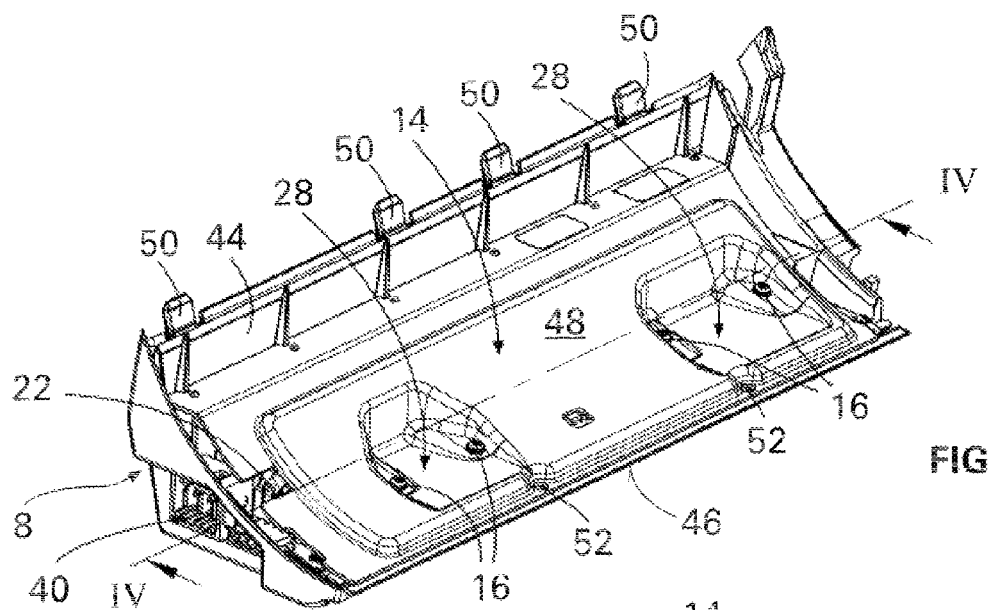
FIG. 2
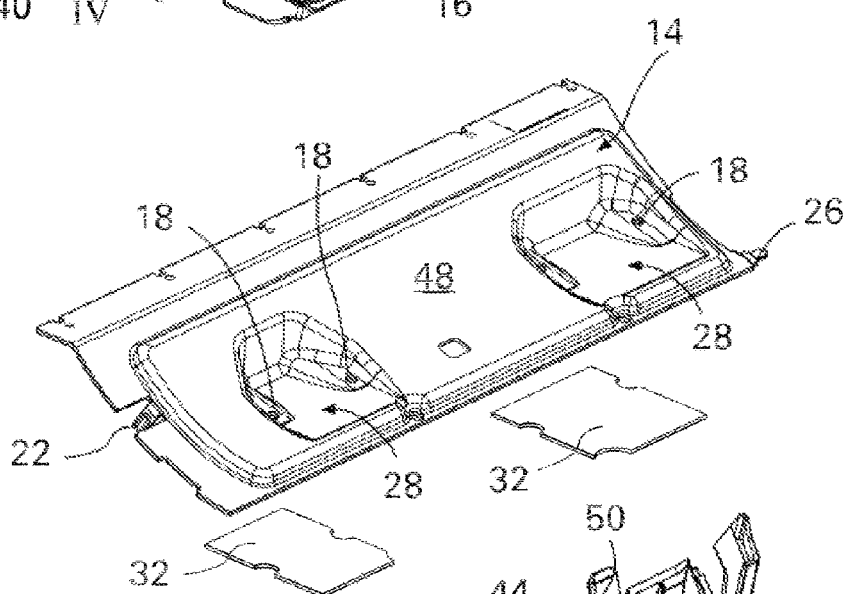
FIG. 3
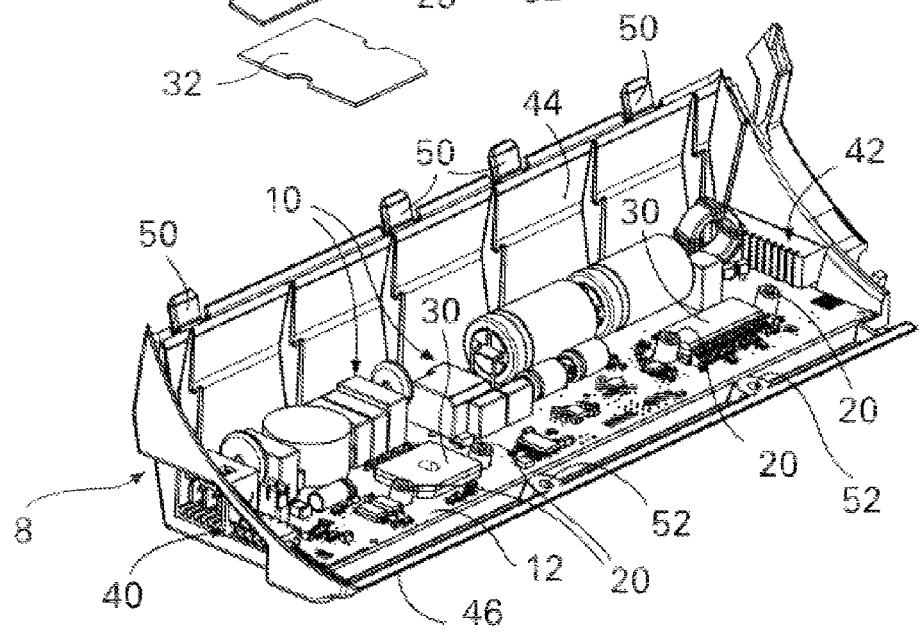

RADIAL BLOWER

CROSS-REFERENCE TO RELATED APPLICATION

This application claims priority to European Patent Application No. 12164901.6, filed Apr. 20, 2012.

FIELD OF THE INVENTION

This invention relates to a blower and in particular a radial blower having a blower wheel positioned so as to rotate inside a blower housing, an electric motor for the rotational drive of the blower wheel, as well as with a cupped-shaped attachment housing positioned externally on the blower housing, wherein the attachment housing contains motor-control electronics.

BACKGROUND OF THE INVENTION

A blower of the above-mentioned type is known in the form of a radial blower from document EP 2 236 838 A1. The electric motor hereby driving the blower wheel positioned inside the blower housing is constructed as an external rotor motor and is positioned inside the blower wheel. In addition, the electric motor is constructed as an electronically commutating direct current motor, frequently also called an EC motor, for which reason a control electronic unit is required for electronic control. In the known blower, this control electronic unit is housed in a unit known as a terminal box which is secured as the attachment housing outside on the blower housing. By using an EC motor this known blower has advantages which, however, have shown in practice that the operating characteristics are still not optimal.

A similar blower is described in EP 0 985 829 B1, wherein an attachment housing secured externally on the blower housing is disclosed solely as a terminal box—which aside from electrical connections for connecting between the connection lines of the electric motor and an external connection cable also contains an operational capacitor required for alternating current motors.

Finally, the publication EP 1 484 509 B1 describes a double blower arrangement with two radial blowers powered by a common coaxial electric motor, wherein the electric motor is located outside between the two blower housings and supports the two radial blower wheel across axially opposed shafts. Here, too, a terminal box is secured externally on one of the two blower housings.

INTRODUCTORY DESCRIPTION OF THE INVENTION

The basic object of this invention is to improve a blower of the type described above with simple constructive means to improve the operating characteristics of the electric motor.

in one embodiment of the present invention, the attachment housing exhibits in its connection area facing the blower housing a metallic cover element covering the motor control electronic and protecting it against an electromagnetic radiation from the electric motor.

The invention is based on the knowledge that, in the operating mode, the rotating electric motor has a disadvantageous electromagnetic influence on the control electronics, because the control electronics is very close to the electric motor because of its placement in the attachment housing. Therefore electromagnetic radiation may be injected into the control electronics which can have adverse effects, so that with regard to operating properties, such as smooth running of the motor, a non-optimal motor control can result.

By means of the inventive cover element, this electromagnetic influence is advantageously eliminated or at least definitely reduced, in that the cover element protects against the electromagnetic radiation produced by the electric motor, so that its coupling into the control electronics is avoided. Thus the cover element forms an "EMV shield" (EMV=electromagnetic tolerance or electromagnetic interference "EMI" shield). Improved operating characteristics are ensured by the protection achieved against electromagnetic couplings.

In another advantageous embodiment of the invention the cover element is so constructed that it performs additional functions, so that we are dealing here with a multi-functional component part.

Thus the cover element which in any case exhibits a ground connection for its function as an "EMV shield" can also be constructed to perform grounding in that it features two ground connections positioned on two opposite side areas. Conveniently, one ground connection from a motor side stator ground can be connected to a side of the cover element. The grounding is guided across the cover element to the other side and can be connected there via a plug connection to an external ground. There thus results a functional grounding with a separation running across the control electronics which due to the spatial separation from the control electronics, which very effectively prevents an EMV coupling.

In addition, the cover element can also advantageously be constructed as a semiconductor-cooling element. To that end, the cover element can exhibit at least one form-stamped contact area which in the mounted state contacts a semiconductor component part of the control electronics for heat transfer. If the control electronics has several semiconductor parts to be cooled, the cover element can be constructed with a corresponding number of such form-stamped contact areas. The heat loss produced from each semiconductor component is thus absorbed by the cover element and released to the environment. Furthermore, it can also be advantageous for the cover element to exhibit surface areas which are fitted to contact the shape of the blower housing. As a result thereof, a heat transfer is achieved inside the housing walls in the flowing air moved across the housing walls. In addition, the housing wall can feature at least one opening in the contact area of the cover element by means of which the moving air flows directly through the cover element and as a result is effectively cooled.

Finally, the attachment housing with the control electronics and the inventive cover element forms a previously assembled component group which can be handled and transported in a secure manner within its point of manufacture until it is mounted to the blower housing. As a result, the cover element advantageously functions by means of its connection to the attachment housing as a mechanical stiffening element, so that the attachment housing can also consist of plastic as an inexpensive shaped part. The mechanical stability is thereby mainly achieved by the metallic cover element.

BRIEF DESCRIPTION OF THE DRAWINGS

The invention will be further explained below based on preferred embodiments illustrated in the drawings.

Shown are:

FIG. 2 is a special perspective view of the housing-side interior of an attachment housing containing control electronics, FIG. 3 is an exploded view of FIG. 2 in perspective.

The same parts in the various figures of the drawing are provided with the same reference numbers.

CONTINUED DETAILED DESCRIPTION OF THE INVENTION

It is expressly emphasized with respect to the following description, that the invention is not limited to the exemplary embodiments and therefore not to all or several features of the property combinations described; moreover, each individual partial feature of the/each embodiment has inventive significance alone and in combination with any desired properties of another embodiment, as well as independently of the feature combinations and referrals back to the claims.

Figure 1:
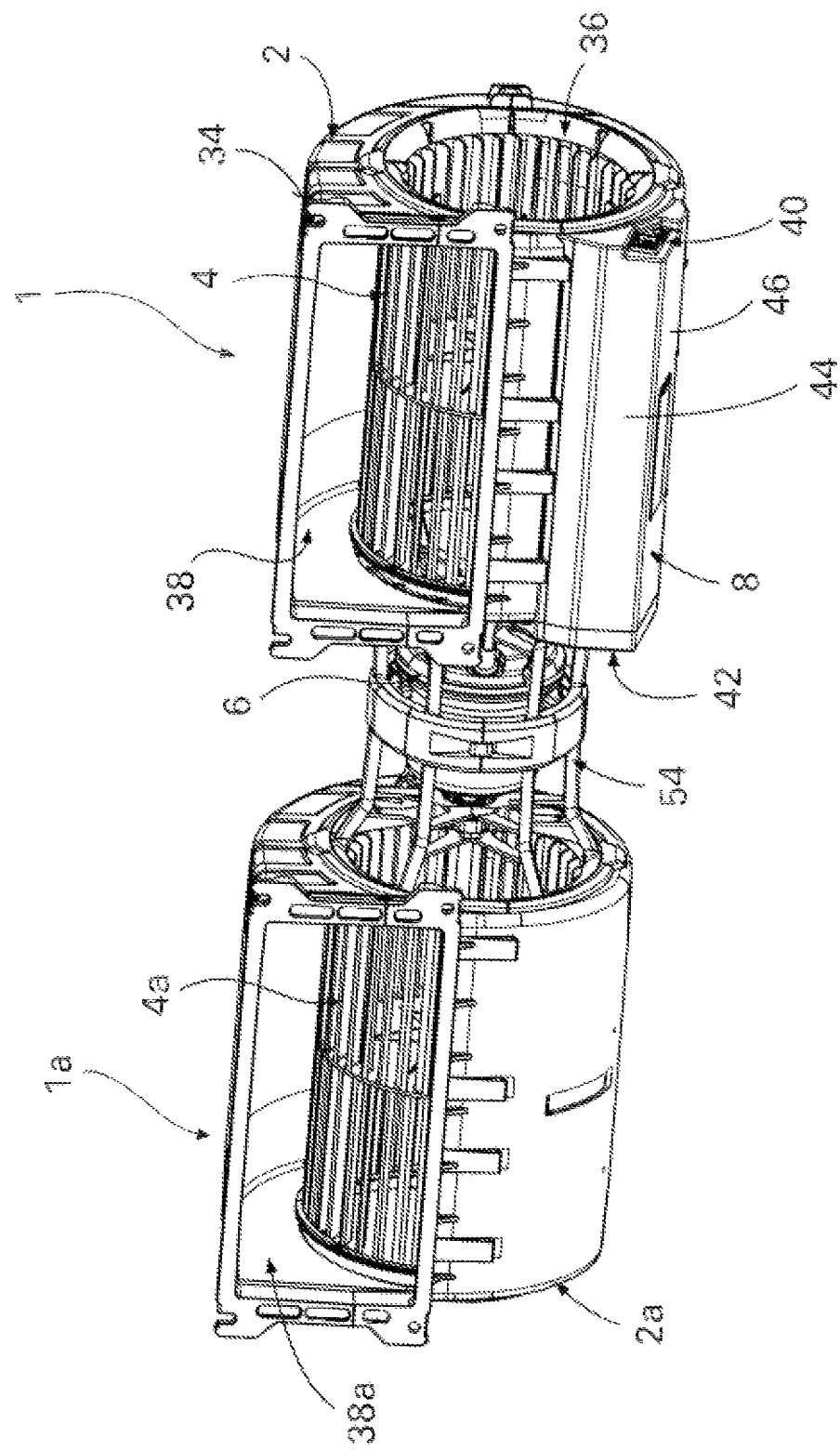
FIG. 1 is a perspective view of an inventive blower, for example, in an embodiment as a double radial blower.

As can be seen initially from FIG. 1, an inventive blower 1 consists of a blower housing 2, a blower wheel 4 positioned so as to rotate inside a blower housing 2, and an electric motor 6 for the rotational drive of the blower wheel 4. Furthermore, a cupped-shaped (concave inner surface) attachment housing 8 is positioned externally on the blower housing 2.

As seen in the special depictions in FIGS. 2 to 5, this attachment housing 8 contains control electronics 10 for the electronic control of the electric motor 6. The electric motor 6 is preferably constructed as an electronically commutating direct current motor, i.e., an EC motor. Therefore the control electronics 10 serves for electronic commutation of the non-depicted stator coils of the electric motor 6 as well as for rotational speed control or regulation. According to FIG. 3 the control electronics 10 is positioned with its component parts on a printed circuit board 12. To that end, reference is made to the cut-away views in FIGS. 4 and 5.

As can also be seen in FIGS. 2 to 5, the attachment housing 8 inventively features a metallic cover element 14 in its connection area—shown as being open in FIG. 3—facing the blower housing 2, said cover element covers the motor-control electronics 10 and protects it against electromagnetic radiation from the electric motor 6. It is useful if the cover element 14 is constructed as a shaped sheet-metal part; it thus consists of a form-stamped and/or form-bent metal sheet, in particular a steel sheet. The shape can best be seen in FIGS. 2 and 3.

There is the further factor that the cover element 14 with the attachment housing 8 and the control electronics 10 is advantageously connected to a previously assembled control component group. To that end, the cover element 14 of FIGS. 2 and 3 is secured in its position covering the control electronics 10 on the attachment housing 8 using screws 16. The screws 16 are guided through screw holes 18 of the cover element 14 and are screwed into screw openings 20 inside the attachment housing 8.

In the resultant connected state, the cover element 14 functions as a protection against contact for the control electronics 10 prior to the final assembly of the control component group by means of the attachment on the blower housing 2.

According to FIG. 3 the cover element 14 features at least one ground wire connection 22. This ground wire connection 22 engages into a contact element 24 positioned in the guide plate 12 for making contact in the assembled position. In another preferred embodiment, the cover element 14 exhibits at least one second ground wire connection 26, whereby the two ground wire connections 22, 26 are positioned to make ground connections to two opposite side areas of the cover element 14.

In another preferred embodiment, the cover element 14 is also constructed as a semiconductor cooling element. For that reason the cover element 14 exhibits at least one form-stamped contact area 28 for two-dimensional contact on a semiconductor component part 30 of the control electronics 10. In the depicted, preferred embodiment, the cover element 14 exhibits two such contact areas 28. Because the or each contact area 28 makes a two-dimensional contact on each component part 30, the heat loss from the component part 30 occurring during operation is discharged across the cover element 14 functioning as a cooling element. To that end it can be useful to position a heat-conducting layer 32 between the/each contact area 28 of the cover element 14 and the associated semiconductor part 30; cf. in particular the enlarged cross-section in FIG. 5. A suitable heat-conducting foil, for example, can be used as the heat-conducting layer 32; cf. FIG. 3.

Because of the mechanical connection to the attachment housing 8, the metallic cover element 14 advantageously also functions as a mechanical stiffening element. Therefore the attachment housing 8 can advantageously consist of a plastic formed part.

The blower 1 is constructed as a radial blower (also known as centrifugal force) in the preferred embodiment; cf. FIG. 1. The blower wheel 4 is thereby constructed as a customary radial blower wheel (also referred to commonly as an impeller or fan wheel). The blower housing 2 forms a spiral housing with a circumferential wall 34 enclosing the idler 4 and at least one axial inflow opening 36. Preferably it involves a double-sided suctioning design with two opposite axial inflow openings 36. The circumferential wall 34 expands in a spiral manner from a small radius to a large radius and then transitions into a tangential outlet opening 38. The direction in which the radius of the circumferential wall 34 is enlarged across the circumference corresponds to the direction of rotation of the blower wheel 4.

In this design it is expedient that the attachment housing 8 is positioned in an area of the circumferential wall 34 which is positioned with a smaller radius adjacent to the outlet opening. By means of the orientation of the outlet opening 38 tangential to the blower wheel 4, there results on the outside in this area between the circumferential wall 34 and the outlet opening 38 a bivalent angle area which is advantageously used to house the attachment housing 8. It is hereby also advantageous if the attachment housing 8 extends across the entire axially measured width of the blower housing 2. In this manner there results the largest possible construction space to accept the control electronics 10 with the smallest possible radial overhang of the attachment housing 8 from the blower housing 2.

Thus the attachment housing 8 exhibits an elongated shape extending parallel to the rotation axis of the blower wheel 4 with two opposite front faces. In the area of these two opposing front faces, the attachment housing 8 features an electrical connection element 40, 42, on the one side for external connection lines (not shown) and on the other side for the motor lines (likewise not recognizable in the drawings) leading to the electric motor 6. The connection elements 40, 42 are preferably constructed as plug-in connectors. Furthermore there is the advantageous provision that the attachment housing 8—viewed in a cross-section perpendicular to the rotation axis of the blower wheel 4—is constructed triangularly with two walls 44, 46 approximately rectangular to each other and a non-depicted opening covered by a cover element 14. One of the walls, according to FIGS. 4 and 5 the wall 46, forms a bottom wall to which the printed circuit board 12 with the control electronics 10 is secured.

The cover element 14 also features surface areas 48 which are adapted for contact with the curved surface of the blower housing 2 or its circumferential wall 34. Achieved thereby is that the heat absorbed by the/each component part 30 is discharged across the cover element 14 and further sent onward across the circumferential wall 34 to the moving air-flow. It can hereby be advantageous to provide at least one opening in the circumferential wall 34 in the contact area of the surface areas 48 of the cover element 14, whereby the moved air in these areas can immediately contact and cool the cover element 14.

Figure 4:
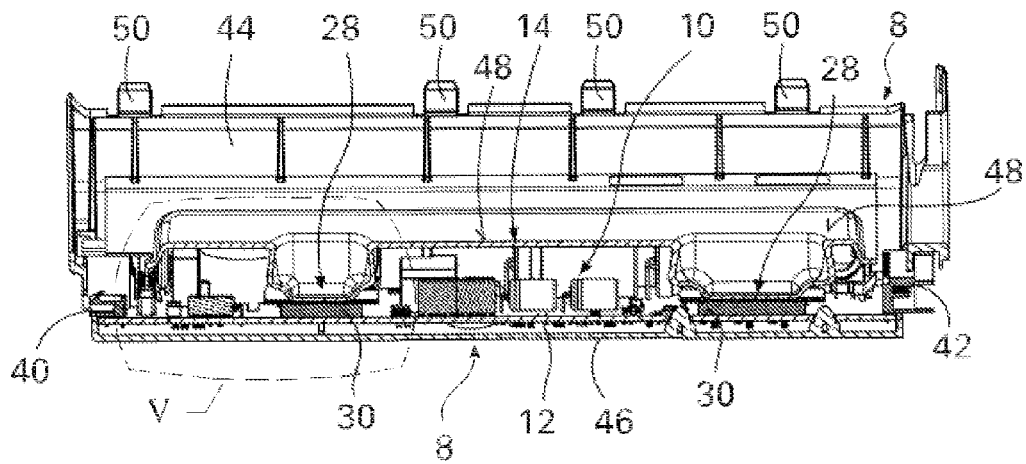
FIG. 4 is a longitudinal cross section in the plane IV-IV according to FIG. 2.
Figure 5:
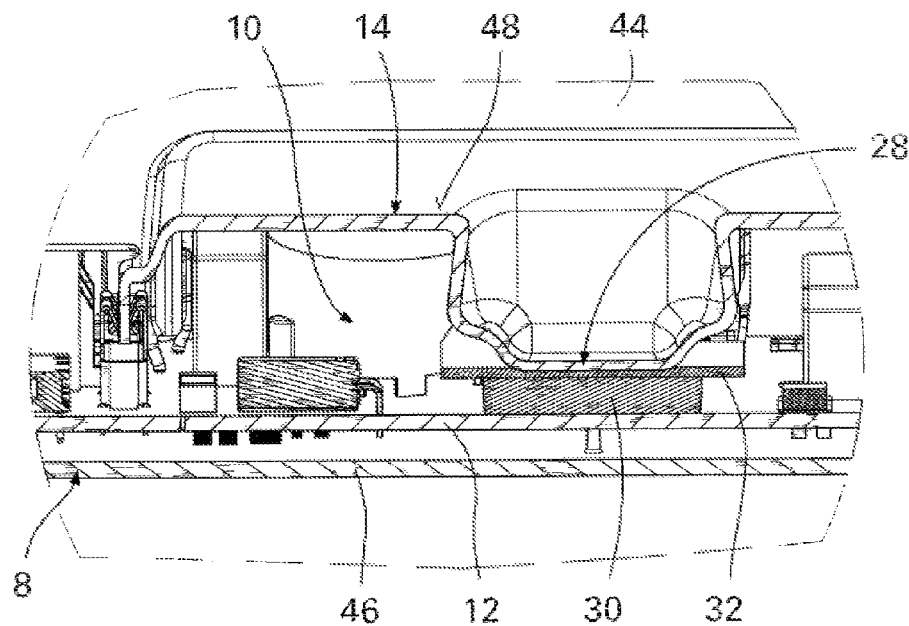
FIG. 5 is a cut-away enlargement of area V in FIG. 4.

As can be seen from FIGS. 2 to 4, the attachment housing 8 exhibits retaining inserts 50 to engage in corresponding retaining openings of the blower housing 2 for an assembly connection with the blower housing 2 on a longitudinal side edge of the one wall 44. Screw holes 52 for non-depicted retaining screws are provided on an opposite longitudinal side edge on the other wall 46.

As also depicted in FIG. 1 and already mentioned at the outset, the inventive blower 1 is preferably a component part of a double blower. The electric motor 6 is thereby positioned outside the blower housing 2 and axially centered between the latter and a second, approximately similar type blower 1a. The electric motor 6 is connected to the two blower wheels 4, 4a via two axially opposed shafts on a common axis (not depicted). Otherwise the second blower 1a corresponds to the previously mentioned embodiment of the first blower 1, aside from the fact that only one of the two blowers, as depicted the blower 1, exhibits the attachment housing 8 with the control electronics 10.

In addition, the embodiment of the double blower largely corresponds to the initially mentioned document, EP 1 484 509 B1, whereby the electric motor 6 together with the blower wheels 4, 4a connected via the shafts forms a fan component group which is suspended between the two blower housings 2, 2a by means of a support 54. The mounting of the double blower occurs via the outlet openings 38, 38a constructed with a flange-like circumferential edge, in that these are secured (flanged) on a fixed, non-depicted console.

The control component group formed by the attachment housing 8, the control electronics 10, and the cover element 14 can also advantageously be preassembled with the mentioned fan component group to a so-called drive train, whereby the attachment housing 8 is secured on one side on the carrier 54. This previously assembled drive train can then be connected in a final assembly with the two blower housings 2, 2a, forming a housing component group.

While the above description constitutes the preferred embodiment of the present invention, it will be appreciated that the invention is susceptible to modification, variation and change without departing from the proper scope and fair meaning of the accompanying claims.

The invention claimed is:

1. A blower (1) comprising a blower housing (2), a blower wheel (4) positioned so as to rotate inside the blower housing (2), an electric motor (6) for the rotational drive of the blower wheel (4), a cupped-shaped attachment housing (8) positioned externally on the blower housing (2),
wherein the blower is a radial blower, wherein the blower wheel (4) is constructed as a radial blower wheel and the blower housing (2) is a spiral housing with a circumferential wall (34) enclosing the blower wheel (4), at least one axial inlet opening (36), and a tangential outlet opening (38),
wherein the attachment housing (8) contains motor-control electronics (10), the attachment housing (8) having, in a connection area facing the blower housing (2), a metallic cover element (14) which covers the motor control electronics (10) and protects the motor control electronics against electromagnetic radiation from the electric motor (6), wherein the cover element exhibits a ground connection, and
wherein the cover element (14) is constructed as a semiconductor-cooling element, wherein the cover element (14) forms at least one form-stamped contact area (28) sized and positioned for two-dimensional heat-conducting contact to a semiconductor component part (30) of the control electronics (10), wherein a heat-conducting layer (32) is positioned between the contact area (28) of the cover element (14) and the semiconductor component part (30), and wherein the cover element exhibits two such contact areas (28).

2. A blower according to claim 1, wherein the cover element (14) is connected to the attachment housing (8) and the control electronics (10) to form a preassembled component group.

3. A blower according to claim 1, wherein the cover element (14) forms at least two ground wire connections (22, 26) positioned on opposite side areas of the cover element, to establish a grounding connection.

4. A blower according to claim 1, wherein the attachment housing (8) consists of a plastic formed part, whereby the metallic cover element (14) functions as a mechanical stiffening element by means of its connection with the attachment housing (8).

5. A blower according to claim 1 wherein the circumferential wall (34) expands in a spiral manner from a smaller radius to a larger radius.

6. A blower according to claim 5, wherein the attachment housing (8) is positioned in an area of the circumferential wall (34) wherein the smaller radius lies adjacent to the outlet opening (38).

7. A blower according to claim 1, wherein the attachment housing (8) features an elongated shape with two opposite sides extending parallel to the rotation axis of the blower wheel (4) across substantially an entire width of the blower housing (2) in axial direction of the rotation axis.

8. A blower according to claim 1, wherein the attachment housing (8) features an electrical connection element (40, 42) in the area of two opposite faces, on one of the faces for external connection lines and on the other of the faces for the motor lines leading to the electric motor (6).

9. A blower according to claim 1, wherein the attachment housing (8) viewed in a cross-section perpendicular to the rotation axis of the blower wheel (4) is constructed triangularly with two walls (44, 46) approximately at a right angle to each other and an opening covered by the cover element (14).

10. A blower according to claim 1, wherein the attachment housing (8) forms one side edge having retaining inserts (50) to engage in corresponding retaining openings of the blower housing (2) for an assembly connection with the blower housing (2), and screw holes (52) for retaining screws on an opposite side edge of the attachment housing.

11. A blower according to claim 1 further comprising the blower in the form of a double blower with the blower housing comprising separated first and second sections, wherein the electric motor (6) is positioned outside the blower housing (2) section and between the blower housing section and wherein the electric motor (6) is connected to two of the blower wheels (4, 4*a*) via two axially opposite shafts on a common axis.

12. A blower according to claim 11, wherein the electric motor (6) is hung on a carrier (54) between the two blower housing sections (2, 2*a*).

13. A blower according to claim 1, wherein the contact area (28) is positioned to be immediately adjacent the semiconductor component part (30).

14. A blower according to claim 1, wherein the contact area (28) is in direct heat-conducting contact with the semiconductor component part (30).

15. A blower according to claim 1, wherein the contact area (28) makes two-dimensional contact with the semiconductor component part (30).

16. A blower according to claim 1, wherein the contact area (28) is spaced away from a remainder of the cover element (14).

\* \* \* \* \*